United States Patent [19]

Funke

[11] Patent Number: 5,698,846
[45] Date of Patent: Dec. 16, 1997

[54] DEVICE AND METHOD FOR IMPROVED MONITORING OF CLIPPING COMPONENTS WITHIN SURGE PROTECTION DEVICES

[75] Inventor: James Funke, Calgary, Canada

[73] Assignee: Tycor International, Canada

[21] Appl. No.: 544,639

[22] Filed: Oct. 18, 1995

[51] Int. Cl.[6] ............................................. G01V 9/04
[52] U.S. Cl. ........................... 250/222.2; 250/559.45;
340/556; 356/338
[58] Field of Search ............................. 250/222.2, 573,
250/574, 559.45; 356/338; 340/555–557;
361/118, 120, 56, 91, 115, 124, 173, 127

[56] References Cited

U.S. PATENT DOCUMENTS

| | | | |
|---|---|---|---|
| 4,247,205 | 1/1981 | Typpo | 250/573 |
| 4,511,889 | 4/1985 | Atwater | 340/629 |
| 4,695,734 | 9/1987 | Honma et al. | 250/573 |
| 4,839,527 | 6/1989 | Leitch | 250/573 |

OTHER PUBLICATIONS

Current Technology™, Guide Specification Main Panel Protection, Sep. 9, 1992, pp. 1–8.

Liebert®, Accuvar ACV Guide Specifications, Sep. 1993, pp. 1–6.

*Primary Examiner*—Que Le
*Attorney, Agent, or Firm*—Dickstein Shapiro Morin & Oshinsky LLP

[57] ABSTRACT

A method and device for detecting when a clipping component within a transient voltage surge suppressor (TVSS) or TVSS with high frequency electrical noise attenuation (both called surge suppression device or SPD) has failed open. The method comprises the steps of: collecting airborne debris and gases generated when the SPD fails open in a space; subjecting the space to a particle detector; diagnosing the detection of particles by the particle detector and communicating the diagnosis to an appropriate signal generator. The device comprises a container within which at least the clipping components of the SPD reside; an open air space within the container; particle detector associated with the space within the container; and an electronic control unit electronically associated with the particle detector to receive a message that airborne debris or gas particles are within the air space inside the container and then to communicate and, as required, act on such.

13 Claims, 3 Drawing Sheets

DEVICE AND METHOD FOR IMPROVED MONITORING OF CLIPPING COMPONENTS WITHIN SURGE PROTECTION DEVICES

FIELD OF THE INVENTION

The present invention relates to the monitoring of the clipping components in alternating current (AC), direct current (DC) and dataline transient voltage surge suppression (TVSS) and electrical noise attenuation circuits (all being referred to hereinafter as surge protection devices or SPDs) incorporated into electrical distribution equipment, stand-alone protection devices, or within the equipment to be protected.

BACKGROUND OF THE INVENTION

SPDs have been available for decades and are not only stand-alone power protection devices but are often incorporated into other power protection devices such as voltage regulators and uninterruptable power supplies. The Institute of Electrical and Electronic Engineers (IEEE) has published numerous studies that indicate transients (also called spikes or surges) and noise (also called high frequency low magnitude interference) are frequent power disturbance problems. These power disturbances have become more significant as microprocessor use has rapidly expanded. As well, microprocessors are becoming more susceptible to transients and noise, causing equipment damage, logic control errors and expensive downtime.

There are many types of SPD designs. The basic components used in SPD circuits consist of:

1. Clipping devices, which are activated by voltage above a certain level and react to voltage only above that level. Typical components include:
   metal oxide varistor (MOV)
   diode or transorb or avalanche diode or zener diode
2. Crowbar devices, which are activated by voltage above certain levels and short the power line until the incoming voltage is lowered to a predetermined level. Typical components include:
   spark gap
   gas tubes
   thyristor (SCR)
3. Electrical noise filter components, which are energy storage devices that react to frequency changes. Typical components include:
   AC capacitors
   Inductors or chokes or coils These components can be arranged in an infinite number of circuits creating effective SPDs. Many circuits have been used for a number of years and a large body of prior art exists such as prior products, electrical engineering teachings and electrical association recommendations.

There are many locations where SPDs can be applied within a facility. The most common location uses a stand-alone SPD device between a wall receptacle and the load to be protected. Another location is within the application or load itself, although the circuits utilized often just contain MOVs. A further location is for SPDs within the electrical distribution equipment of a facility. This equipment includes circuit breakers, meter panels, panel boards, switch boards, switch gear and motor control centers. Additional applications for SPDs are found in DC and dataline protective devices. The invention can be applied in any of the above locations but is most practical when applied in SPDs located within a facility's electrical distribution equipment.

The monitoring of SPDs has a number of generic steps. Detection identifies a fault or confirms proper operation of the SPD's components. Diagnostics interpret the detection results and instruct required actions. The diagnostics are usually completed by electronic controls units or circuit boards. Communication of the SPDs status is then performed by indicator lights, audible warnings, or electronic remote controls. Actions can also be triggered by the diagnostics such as automatic shutdown of the SPD or parts of the SPD.

The diagnostic, communication, and action systems used for determining the SPD's operating status on a real time and continuous basis, have become very sophisticated giving the appearance of extremely accurate and consistent monitoring. In fact, current detection techniques usually only monitor short conditions, and to a much lesser extent mis-wiring and/or high thermal temperatures. If a component fails open, existing detection systems cannot recognize this status. This results in diagnostic and communication breakdowns as the SPD appears operational but is actually providing diminished or no protection at all. Without an accurate method to detect clipping components that fail open, SPD circuits will continue to fail without any warning signals, and the protection of sensitive equipment will not be fulfilled. Failure of the protected equipment may be the first indication the SPD is not operating.

The invention relates to clipping components, which consist of MOVs or avalanche diodes (also called zener diodes, transorbs, or diodes) within an SPD. These clipping components can fail in three states, as follows:

1) A short or closed state is when the materials within the clipping component become fused providing little or no impedance to current flow at the electrical circuit's normal operating conditions. A short state is caused by repeated or large surges, continuous over-voltage, or extreme temperatures.

2) An open failure occurs when a clipping component within an SPD circuit is no longer able to conduct electrical current. An open failure is caused by repeated or large surges, continuous over-voltage, or extreme temperatures.

3) A near or partial short occurs when the clipping component's materials become partially fused causing a continuous current flow at normal operating conditions. This continuous current, typically called thermal run-away, is small at first but will eventually cause a failure as the component's temperature rises over time. Failure is ultimately either a short (heat causing fusing) or open circuit failure (component(s) rapidly expand). Thermal run-away may last minutes or hours.

Other typical components within a SPD circuit include crowbar devices, AC capacitors and inductors. While not directly related to the invention, their failure often impacts clipping components in the same circuit.

Crowbar components are often used instead of clipping components. Gas tubes consist of an air gap between conducting materials. The physical space between the conducting materials prevents conductivity except when high voltages cause a spark between the conducting material points. They fail due to the distance between the points changing. If the points become too far apart, the component is similar to an open failure; if too close the spark voltage is lowered; if touching a short occurs. Only the short failures can be monitored. Other types of failure require physical or visual detection.

AC capacitors rarely fail. The material within them has self healing properties that eliminate (insulate) internal shorts.

Inductors rarely fail open or short. During over-voltage or over-current conditions, they will overheat but continue to operate. Inductors can overheat to the level of physical distortion or melting, but this is unlikely as other components usually fail first due to the high temperature created by the inductors.

There are one common, and two less common, SPD detection methods currently used. The most common method uses an over-current protection device resident within the SPD circuit or that separates it from the electrical system. If the over-current device disconnects the SPD, this is indicative of a short failure within the SPD. This event can be detected and is well known to those adept at the art of SPD monitoring. Opto isolators are the most common monitoring circuit used. This monitoring can be performed in a number of ways, ranging from monitoring only the live lines entering a SPD filter circuit to monitoring individual components with a separate fuse for each component.

A second method, often with its own communication signal (different indicator light), monitors mis-wiring within an electrical system. This feature is typically available on single phase plug-in devices of 15 amps or less. The purpose is to indicate the reversal of line and neutral, or line and ground, or a missing wire. This monitoring does not indicate component failure.

The third method of monitoring, although rare, is to monitor thermal temperature within a SPD or its components. Some products claim to contain temperature thermal monitoring and internal over-current protection using silver wiring. However, silver wiring melts at over 900° C. and most SPD filter components will fail before this, making this technique irrelevant. A thermal monitor that activates a signal when temperatures rise above 100° C. can detect clipping component thermal run-away. This type of detection also warns that AC capacitors or inductors are overheating.

There is little prior art that details SPD monitoring systems. Available literature does not describe the method of detecting or types of faults identified. This vagueness may be due to existing methods only monitoring shorts and not open fault. By not monitoring and hence communicating the open faults on clipping components, these faults can exist and a SPD circuit will appear to be operational when in fact protection has diminished or there is no protection at all.

The reason open faults cannot be monitored for clipping components is that their activation voltage (MCOV) is higher than the electrical or dataline system's operating voltage. Under normal system operating conditions clipping components are "relatively" inactive, or effectively, from an electrical circuit perspective, in an open condition. This makes the detection of a clipping device that has in fact failed open, very difficult.

It is theoretically possible to monitor these components at normal operating conditions. Very low current or voltage can be measured flowing through the "idle" clipping components. The practical problem is that clipping components activate under surge conditions with current flows increasing to thousands of amps for milli-seconds or longer. For example, the following amperage could flow through a clipping component within a SPD in parallel on a 120V panel:

| Situations | Amps | Comment |
| --- | --- | --- |
| normal operation | $1 \times 10^{-4}$ amps | idle clipping component |
| typical surge | $1 \times 10^{3}$ amps | repeatable |
| max. MOV spec. | $1 \times 10^{5}$ amps | rarely reached |

Detection systems able to sense currents of $1 \times 10^{-4}$ and survive currents ranging up to $1 \times 10^{5}$ amps do not exist for in-situ SPD applications.

Clipping components can be tested by simulating surges (such as a 1 mA test) and measuring the output through the component. This generic method appears to have been utilized by Current Technology's Power Sifter™ which uses a Diagnostic Test Set. This unit requires SPD circuit to be disconnected from the electrical system and a manually operated test to be performed. This technique does not provide a continuous and real-time detection as the TVSS circuit must be temporarily removed from the electrical system at the time of testing. If multiple clipping components are in parallel, this technique tests only the lowest MCOV clipping component still operating. A clipping component that has failed open would not be detected until all parallel components failed open.

The use of an on-line surge generator (i.e. integrated into the SPD) is not feasible for the generated surge would be transmitted into the electrical distribution system if the clipping components have failed open. This may damage the load(s) the SPD is intended to protect.

The visual monitoring of clipping components is also being used. For example some clipping components are shown through transparent windows in an enclosure with instructions matching colour changes to failure. This works for clipping components that fail open by burning or violently expanding. However, these components will also split at the side when failing open providing no visual indication of failure. This method provides no electrical signal for diagnostic, communication, or automated action.

OBJECT OF THE INVENTION

It is thus an object of the present invention to provide real-time and cost effective detection of clipping components that have failed open within a SPD allowing for diagnostic, communication and/or automated action to occur.

SUMMARY OF THE INVENTION

The present invention is based on the principle that a clipping component will expel airborne debris and gases when it fails open.

Thus, in accordance with the present invention there is provided a method of detecting when a clipping component within a transient voltage surge suppressor (TVSS) or TVSS with high frequency electrical noise attenuation (both called surge protection device or SPD) has failed open. The method comprises the steps of: i) collecting airborne debris and gases generated when the SPD fails open in a space; ii) passing light from a transmitter through that space to a light receiver monitoring the light received by the receiver and any changes in the strength of light received there; iii) diagnosing the detection of a change in power of the light received by the receiver; and iv) communicating the diagnosis to an appropriate signal means to generate a diagnostic signal.

The invention also relates to a monitoring device to detect when a clipping component within a SPD with clipping components, has failed open. The device comprises a container within which at least the clipping components of the SPD reside; an open air space within the container; particle detection means associated with the space within the container; and an electronic control unit electronically associated with the particle detector to receive a message that airborne debris and gas particles are within the air space inside the container and then to communicate and, as required, act on such.

BRIEF DESCRIPTION OF THE DRAWINGS

These and other advantages of the invention will become apparent upon reading the following detailed description and upon referring to the drawings in which.

While the invention will be described in conjunction with example embodiments, it will be understood that it is not intended to limit the invention to such embodiments. On the contrary, it is intended to cover all alternatives, modifications and equivalents as may be included within the spirit and scope of the invention as defined by the appended claims.

DETAILED DESCRIPTION OF THE INVENTION

Current monitoring techniques of clipping components (MOVs and zener diodes) used in SPD circuits, utilize detection circuits that recognize when an over-current device has tripped, as a result of a short circuit condition. Less commonly used are thermal sensors, which may recognize when the temperature of components becomes too high, indicating thermal run-away or other problems. When a problem is recognized by the detection circuitry, it can be communicated, and acted on, in a number of ways. Typically there is a visual LED signal, or a red light, on the unit for each phase, or an audible alarm can be utilized. Communication techniques also allow remote control centres to be notified if a problem is detected. This is typically done by relay contacts or other remote communicating techniques. Electronically controlled actions can also be performed, such as a thermal probe which indicates high temperatures. This can trigger a relay (or relays) which disconnects the entire SPD circuit or just one phase of a multi-phase electrical system. Communication and electronically controlled actions are controlled by a circuit board or electronic processor which is part of the unit and provides the diagnostics for the detection circuitry. These detection, diagnostic, communication and action techniques are well known and understood by those adept at SPD circuitry.

The type of failures currently not monitored are open failures. The invention provides a device and technique for detecting open failures of clipping components within a SPD filter circuit.

A common property of clipping components is that when they fail open, they expel debris, gases, and/or smoke. The invention monitors the lack or presence of such debris to indicate if a clipping component has failed short.

Figure 1:
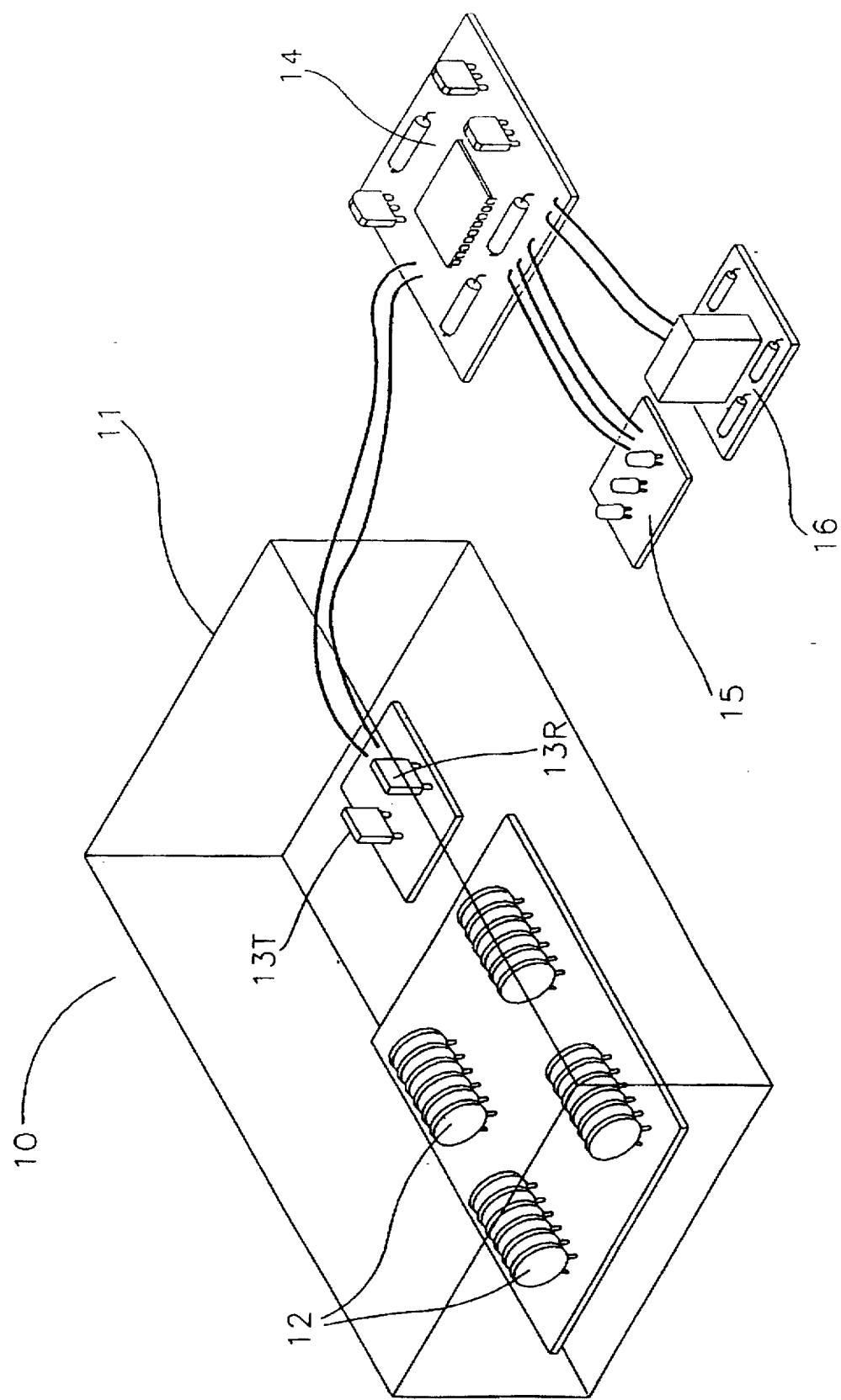
FIG. 1 is a schematic perspective view of a monitoring device in accordance with the present invention.

Turning to FIG. 1, there is an illustrated example of a monitoring device for a SPD 10 comprising a container 11 which is enclosed on all six sides. The SPD may contain crowbar components, inductors, AC capacitor, fuses, and clipping components. The figure only shows the clipping components 12 as they are the relevant components to the invention. When clipping components fail open their internal material changes state and is released from the clipping component. This airborne debris and gases remain concentrated within the container 11. Transmitter 13T and receiver 13R are contained within the same container 11 as the clipping components 12.

The transmitter 13T and receiver 13R send a signal between themselves. This signal can be any part of the frequency spectrum from 300 micrometers to $3 \times 10^{-5}$ micrometers or otherwise referred to as either infrared, visual, or ultraviolet light (referred to as the spectrum signal). When no airborne debris is present, the signal is unobstructed. This is communicated to an electronic control unit 14, including a microprocessor, which diagnoses for failure relayed not only from the invention but preferably also from over-current devices, thermal sensors, and/or mis-wiring sensors.

When a clipping component 12 fails open, it releases airborne debris and gases into the container 11. As this debris is not able to quickly escape, it blocks the path of the spectrum signal between the transmitter 13T and receiver 13R. This obstruction of the signal is communicated to the electronic control unit 14 that activates the appropriate communication signals such as LED warnings 15 or relay contacts 16.

As the airborne debris settles or escapes the container, the spectrum signal may be received again. The electronic control unit 14 is programmed to remember that a failure has occurred and continues communicating the appropriate warning until it is reset.

The container 11 serves a second purpose of avoiding false alarms. By the invention being enclosed, dust or smoke will not enter the contained space and accidentally obstruct the spectrum signal.

Note that infrared, visible or ultraviolet, signals are not the only methods for detecting airborne debris and gases. Other methods include chemical or physical particle detectors. For cost and reliability reasons, a spectrum detector is most appropriate.

Figure 2:
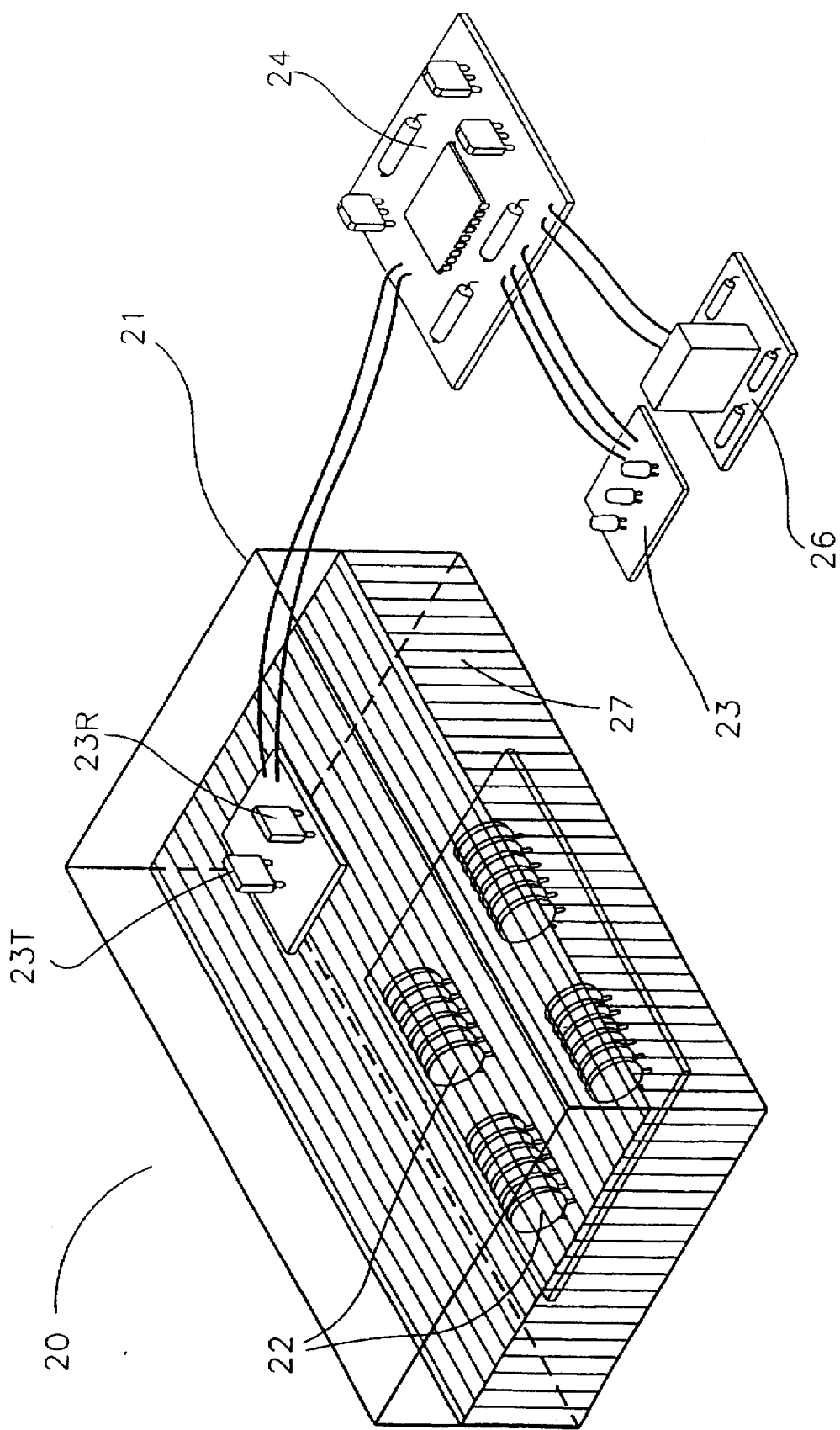
FIG. 2 is a schematic perspective view of an alternative embodiment of the invention for an arrangement of SPD where the clipping components are shallow within epoxy.

In the alternative embodiment of the present invention illustrated in FIG. 2, a SPD 20 is shown with the clipping components embedded and entirely surrounded by epoxy 27. The six-sided container 21 encasing these components is large enough to contain both the epoxy and provide a space above the epoxy for the spectrum transmitter 23T and receiver 23R. The clipping components 22 should be near the surface of the air space. It is important that an escape route to the open air space exists. By being near the surface of the open air space and because the epoxy will be weakest near the surface, the airborne debris will be expelled into that region. MOVs buried deep within epoxy may be able to breach the container and not enter the air space. Otherwise, this variation of the invention operates as per FIG. 1.

Figure 3:
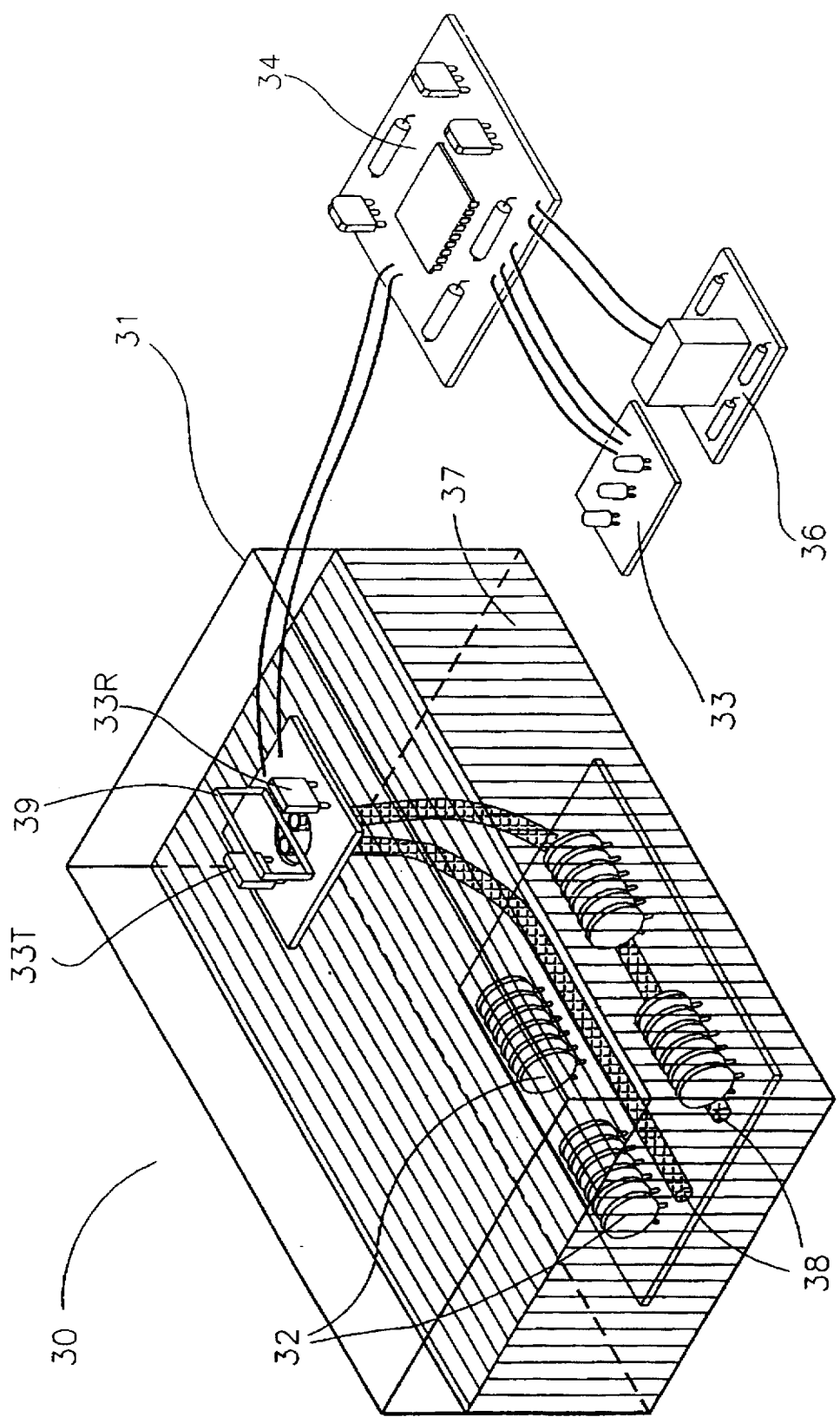
FIG. 3 is a schematic perspective view of yet another alternative embodiment of the invention for an arrangement of SPD where the clipping components are deep within epoxy.

Often design restraints do not allow clipping components to be near the surface of the epoxy adjoining the air space. In such circumstances, an air passage must be available to the clipping components. Otherwise, the violent release of gases and air borne debris from clipping components that fail open, may not enter the open space. FIG. 3 details another variation of the invention 30 where a tube(s) 38 is placed next to the clipping components 32 in the epoxy 37 with a single end open to the air space which is within the container 31. For added concentration a transparent plate 39 is at the exit of the tube 38. The transmitter 33T and receiver 33R send their spectrum signal through the transparent material 39.

When a clipping component 32 fails open, it will release its gases and airborne debris into the tube 38 as this is the path of least resistance. The tube 38 will carry the debris out its exit where a portion will adhere to the transparent plate 39. This film of smoke will obstruct the signal from the spectrum transmitter to the receiver which is communicated to the electronic control unit 34. The control unit 34 activates the appropriate communication signals such as LED warnings 35 or relay contacts 36.

Unlike the other embodiments of FIGS. 1 and 2, in that of FIG. 3, the electronic control unit 34 does not require memory of a failure after the smoke has settled. This is physically achieved by the transparent plate 39 retaining the coating of debris, which will continue to block the spectrum signal. The container is still important to separate the space from outside dust or smoke which may block the signal and cause a false detection.

Thus, it is apparent that there has been provided in accordance with the invention a device and method for improved monitoring of clipping components within surge protection devices that fully satisfies the objects, aims and advantages set forth above. While the invention has been described in conjunction with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the invention.

What I claim as my invention:

1. A method of detecting when a clipping component within a transient voltage surge suppressor (TVSS) or TVSS with high frequency electrical noise attenuation (both called surge suppression device or SPD) has failed open, comprising the steps of:

i) collecting airborne debris and gases generated when the SPD fails open in a space associated with the SPD;

ii) passing light from a transmitter through that space to a light receiver monitoring the light received by the receiver and any changes in the strength of light received there;

iii) diagnosing the detection of a change in power of the light received by the receiver; and iv) communicating the diagnosis to an appropriate signal means to generate a diagnostic signal.

2. A method according to claim 1 further including the step of remembering the detection of the change in power of light received by the receiver until the diagnostic signal has been acted upon.

3. A method according to claim 1 wherein the light transmitter is selected from the group consisting of infrared, visible and ultraviolet light transmitters.

4. A method of detecting when a clipping component within a transient voltage surge suppressor (TVSS) or TVSS with high frequency electrical noise attenuation (both called surge suppression device or SPD) has failed open, comprising the steps of:

i) collecting airborne debris and gases generated when the SPD fails open in a space;

ii) subjecting the space to particle detection means;

iii) diagnosing the detection of particles by the particle detection means; and iv) communicating the diagnosis to an appropriate signal means.

5. A method according to claim 4 wherein the particle detection means are selected from the group consisting of light transmitter and receiver, physical particle detection means and chemical particle detection means.

6. A monitoring device to detect when a clipping component within a transient voltage surge suppressor (TVSS) or TVSS with high frequency electrical noise attenuation (both called surge protection device or SPD) having clipping components, has failed open comprising:

i) a container within which at least the clipping components of the SPD reside;

ii) an open air space within the container;

iii) particle detection means associated with the space within the container; said detection means adapted to generate a signal when airborne debris or gas particles generated through failure of the SPD are detected within the air space; and iv) an electronic control unit electronically associated with the particle detector to receive the signal that airborne debris or gas particles are within the air space inside the container and then to provide a response.

7. A device according to claim 6 wherein the particle detector as selected from the group consisting of chemical particle detectors, physical particle detectors and light signal transmitters and receivers.

8. A device according to claim 6 wherein the particle detector comprises a light signal transmitter and a light receiver located so as to receive light passed through the open air space by the transmitter.

9. A device according to claim 8 wherein the signal transmitter and receiver are selected from the group consisting of infrared, ultraviolet and visible light.

10. A device according to claim 6 wherein the clipping components are epoxyed within the container and portions of the clipping components are proximal to the open air space by being near the surface of the epoxy.

11. A device according to claim 6 wherein the clipping components are epoxyed within the container and an air tube runs near the clipping components to collect airborne debris or gases from the clipping components, the tube leading to the open air space inside the container to pass said debris or gases to that space.

12. A device according to claim 6 further comprising diagnostic means to interpret and remember the detection of debris or gases in the space.

13. A device according to claim 12 further comprising signal means associated with the control unit, said signal means to be actuated on detection of airborne gas or debris in the space.

* * * * *